United States Patent
Takasawa et al.

(10) Patent No.: US 8,470,651 B2
(45) Date of Patent: Jun. 25, 2013

(54) METHOD FOR PRODUCING A THIN FILM TRANSISTOR, AND A THIN FILM TRANSISTOR

(75) Inventors: Satoru Takasawa, Chiba (JP); Satoru Ishibashi, Sammu (JP); Tadashi Masuda, Kamagaya (JP)

(73) Assignees: Mitsubishi Materials Corporation, Tokyo (JP); Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/064,858

(22) Filed: Apr. 21, 2011

(65) Prior Publication Data

US 2011/0233550 A1    Sep. 29, 2011

Related U.S. Application Data

(63) Continuation of application No. PCT/JP2009/068059, filed on Oct. 20, 2009.

(30) Foreign Application Priority Data

Oct. 24, 2008  (JP) .................. 2008-273737
May 12, 2009   (JP) .................. 2009-115690

(51) Int. Cl.
    *H01L 21/84*    (2006.01)
(52) U.S. Cl.
    USPC ..... 438/158; 438/149; 438/475; 257/E21.212
(58) Field of Classification Search
    USPC ................ 438/149, 158, 475; 257/57, 60, 66, 257/E21.414, E29.291, E29.294, E21.212
    See application file for complete search history.

(56) References Cited

U.S. PATENT DOCUMENTS

| | | | |
|---|---|---|---|
| 2008/0009108 A1* | 1/2008 | Lin et al. | 438/158 |
| 2009/0236603 A1 | 9/2009 | Takasawa et al. | |
| 2009/0303406 A1 | 12/2009 | Takasawa et al. | |
| 2011/0133190 A1* | 6/2011 | Mori et al. | 257/57 |
| 2011/0193088 A1* | 8/2011 | Mori et al. | 257/57 |

FOREIGN PATENT DOCUMENTS

| | | |
|---|---|---|
| JP | 04-349637 A | 12/1992 |
| JP | 2008-191541 A | 8/2008 |
| JP | 2008-205420 A | 9/2008 |
| JP | 2009-070881 A | 4/2009 |
| WO | WO-2008/081805 A1 | 7/2008 |
| WO | WO-2008/081806 A1 | 7/2008 |

OTHER PUBLICATIONS

International Search Report mailed Nov. 24, 2009, issued for PCT/JP2009/068059.

Notification of Reason(s) for Refusal mailed Jan. 22, 2013, issued for the Japanese patent application No. 2008-502893 and English translation thereof.

\* cited by examiner

*Primary Examiner* — Jose R Diaz
(74) *Attorney, Agent, or Firm* — Edwards Wildman Palmer LLP

(57) ABSTRACT

Provided is a metallic wiring film which is not peeled away even when exposed to a hydrogen plasma. A metallic wiring film is constituted by an adhesion layer containing copper, Ca, and oxygen and a low-resistance metal layer (a layer of a copper alloy or pure copper) having a lower resistance than the adhesion layer. When the adhesion layer is composed of a copper alloy, which contains Ca and oxygen, and a source electrode film and a drain electrode film adhering to an ohmic contact layer are constituted by the adhesion layer, even if the adhesion layer is exposed to the hydrogen plasma, a Cu-containing oxide formed at an interface between the adhesion layer and the ohmic contact layer is not reduced, so that no peeling occurs between the adhesion layer and a silicon layer.

5 Claims, 4 Drawing Sheets

METHOD FOR PRODUCING A THIN FILM TRANSISTOR, AND A THIN FILM TRANSISTOR

This application is a continuation of International Application No. PCT/JP2009/068059 filed Oct. 20, 2009, which claims priorities to Japanese Patent Application No. 2008-273737, filed on Oct. 24, 2008 and Japanese Patent Application No. 2009-115690, filed on May 12, 2009. The entire disclosures of the prior applications are herein incorporated by reference in their entireties.

BACKGROUND

The present invention generally relates to a transistor having electrode films made of a copper alloy, and a method for producing the transistor.

Due to an increase in size of a current TFT (Thin Film Transistor) panel, Al-based wirings having a low resistance are widely used. With recent pervasiveness of large-size televisions, the TFT panels are also becoming larger and larger, so that demand for Cu-based wirings having a lower resistance has been increasing instead of the Al-based wirings so as to lower the resistance of the wirings and the costs of the panels.

When the Cu-based wirings are used for a TFT panel, adhesion to a glass substrate or an underlying film is bad, so that there is such a problem that diffusion of atoms (deterioration of barrier property) occurs between the Si layer, which becomes a underlayer, and the Cu-based wiring. In general, Mo-based or Ti-based barrier metal layers are used in the case of the Al-based wirings.

However, although Mo is easily wet etched, it has a problem that the cost of the material is high. On the other hand, although the material cost of the Ti is relatively low, it has a problem that the wet etching is difficult. These problems contribute to cost increase.

The inventors of the present invention have developed techniques for forming underlying layers by oxygen-mixed sputtering with use of a Cu alloy target, such as Cu—Mg and Cu—Zr (Patent Document 1), or a pure Cu target (Patent Document 2).

By the above-described techniques, an oxide ($Cu_x$—$O_y$, $X_X$—$O_y$, $Cu_x$—$X_y$—$O_z$; X is an alloying addition) is formed at an interface of the glass substrate or an underlying layer, and the oxidation layer becomes an adhesion and barrier layer. Further, the Mo-based and Ti-based barrier metal layers become unnecessary, so that a Cu wiring process is possible to realize a low resistance and a low cost. See, International publication Nos. WO2008/081806 and WO2008/081805.

SUMMARY OF THE INVENTION

However, in a recent TFT process, it is necessary to perform a processing with a hydrogen plasma after the formation of source and drain electrodes. In that case, there occurs such a problem that the adhesion of the Cu wiring formed by the above-described technique is deteriorated. In the case of the Cu alloy target, such as Cu—Mg or Cu—Zr, it is confirmed that the oxide formed at the interface is reduced with the hydrogen plasma and the adhesion is deteriorated.

As a result of the investigative research of those addition elements for the Cu alloys which are not reduced with the hydrogen plasma, the inventors of the present invention discovered a Ca-containing oxide and came to create the present invention.

The present invention, which has been made based on the above-described knowledge, is directed to a method for producing a thin film transistor including the steps of a gate electrode forming step to form a gate electrode on an object to be processed, a gate insulating layer forming step to form a gate insulating layer on the gate electrode, a high-resistance semiconductor layer forming step to form a high-resistance semiconductor layer made of a semiconductor layer on the gate insulating layer, an ohmic contact layer forming step to form an ohmic contact layer on the semiconductor layer, a metallic wiring film forming step to form a metallic wiring film on the ohmic contact layer, and an etching step to form a source region and a drain region from the ohmic contact layer and to form a source electrode on the source region and a drain electrode on the drain region from the metallic wiring film by patterning the ohmic contact layer and the metallic wiring film, wherein the metallic wiring film forming step includes an adhesion layer forming step to sputter a target of a copper alloy containing Ca and copper in a vacuum atmosphere through introduction of a gas containing a sputtering gas and an oxidizing gas and to form an adhesion layer containing copper, Ca and oxygen on the ohmic contact layer.

The present invention is directed to the method for producing the thin film transistor, wherein the high-resistance semiconductor layer is exposed in the etching step, and a plasma-exposed step, in which a surface of the high-resistance semiconductor layer, a surface of the source electrode and a surface of the drain electrode are exposed to a plasma containing a hydrogen gas in a state where those surfaces are exposed, is provided after the etching step.

The present invention is directed to the method for producing the thin film transistor, wherein the copper alloy target contains Ca at a rate of 0.1 atomic % or more and 5.0 atomic % or less.

Further, the present invention is directed to the method for producing the thin film transistor, wherein, in the metallic wiring film forming step, a low-resistance metal layer forming step, in which a low-resistance metal layer having a lower resistance than the adhesion layer is formed on the adhesion layer, is provided after the adhesion layer forming step.

The present invention is directed to the method for producing the thin film transistor, wherein the low-resistance metal layer is composed of a copper alloy or pure copper.

The present invention is directed to the method for producing the thin film transistor, wherein an $O_2$ gas is used as the oxidizing gas, and the $O_2$ gas is contained in a range of 3 parts by volume or more and 20 parts by volume or less relative to 100 parts by volume of the sputtering gas.

The present invention is directed to a thin film transistor comprising a gate electrode formed on a substrate, a gate insulating layer formed on the gate electrode, a high-resistance semiconductor layer formed on the gate insulating layer and made of a semiconductor layer, a source region and a drain region composed of an ohmic contact layer formed on the high-resistance semiconductor layer, the source region and the drain region being separated from each other, and a source electrode and a drain electrode formed on the source region and the drain region, respectively, wherein the source electrode has an adhesion layer including a copper alloy containing Ca and oxygen at a contacting face between the source electrode and the source region, and the drain electrode has an adhesion layer including a copper alloy containing Ca and oxygen at a contacting face between the drain electrode and the drain region.

The present invention is directed to the thin film transistor, wherein the source region and the drain region are of an n-type semiconductor layer.

The present invention is directed to the thin film transistor, wherein a low-resistance metal layer having a lower resistance than the adhesion layer is arranged on the adhesion layer.

The present invention is directed to the thin film transistor, wherein the low-resistance metal layer is composed of a copper alloy or pure copper.

The present invention is directed to the thin film transistor, wherein Ca is contained at a rate of 0.1 atomic % or more and 5.0 atomic % or less relative to metals contained in the adhesion layer.

In the present invention, a semiconductor composed mainly of silicon, such as polysilicon and amorphous silicon, is called a silicon layer.

EFFECT OF THE INVENTION

A stable oxide which is not reduced with the hydrogen plasma is formed at the interface of the underlying layer, so that good adhesion and barrier property can be obtained.

DETAILED DESCRIPTION OF THE INVENTION

Figure 1:
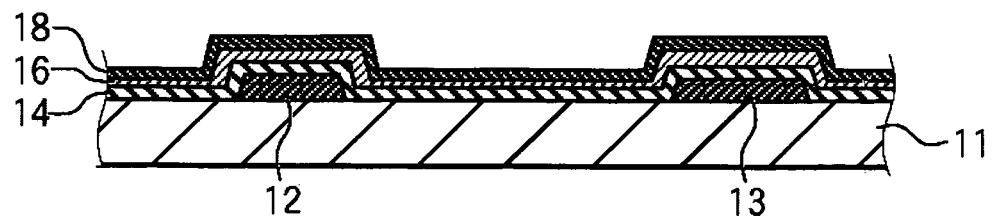
FIGS. 1(a) to (c) are views (1) illustrating the method for producing a transistor according to the present invention.
Figure 1:
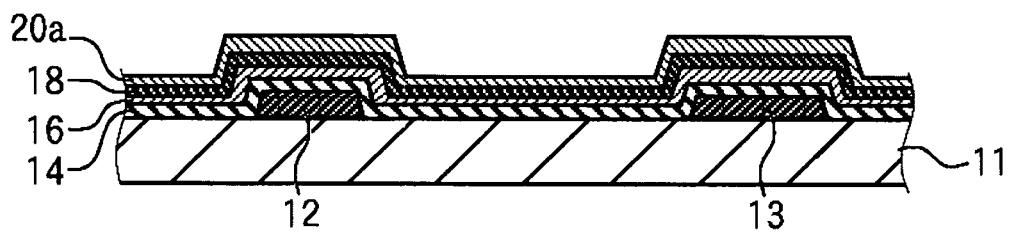
Figure 1:
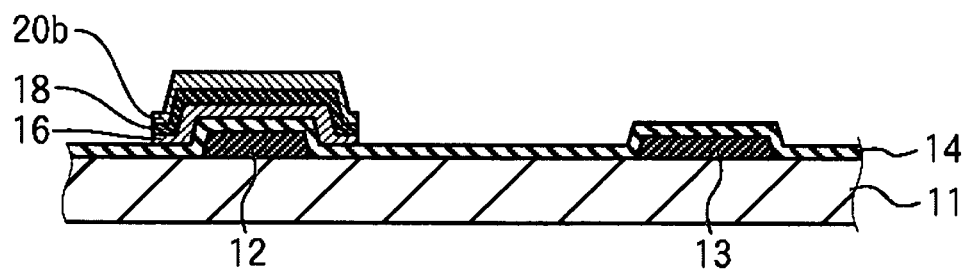

In FIG. 1(a), a reference numeral 10 denotes an object to be processed which is used in the transistor-producing method of the present invention.

Referring to the object to be processed 10, the object to be processed 10 has a transparent substrate 11 of a glass or the like, and a gate electrode 12 and a pixel electrode 13 are arranged on the transparent substrate 11 in such a manner that the gate electrode 12 and the pixel electrode 13 are spaced from each other.

On the transparent substrate 11 are arranged a gate insulating layer 14 of an insulating layer, a high-resistance semiconductor layer 16 of a silicon layer, and an ohmic contact layer 18 which is a silicon layer having a lower resistance than the high-resistance semiconductor layer 16 by addition of impurity, in this order from a side of the transparent substrate 11, in such a manner that the gate insulating layer 14, the high-resistance semiconductor layer 16, and the ohmic contact layer 18 cover the gate electrode 12 and the pixel electrode 13.

A non-doped a-Si is preferably used for the high-resistance semiconductor layer 16; and a phosphorus-doped n-type a-Si is preferably used for the ohmic contact layer 18.

The high-resistance semiconductor layer 16 and the ohmic contact layer 18 are constituted by amorphous silicon. However it may be made of a polysilicon. The gate insulating layer 14 is an insulating film which is a thin film of silicon nitride or the like. The gate insulating layer 14 may be a film of silicon oxynitride or other insulating film.

Figure 5:
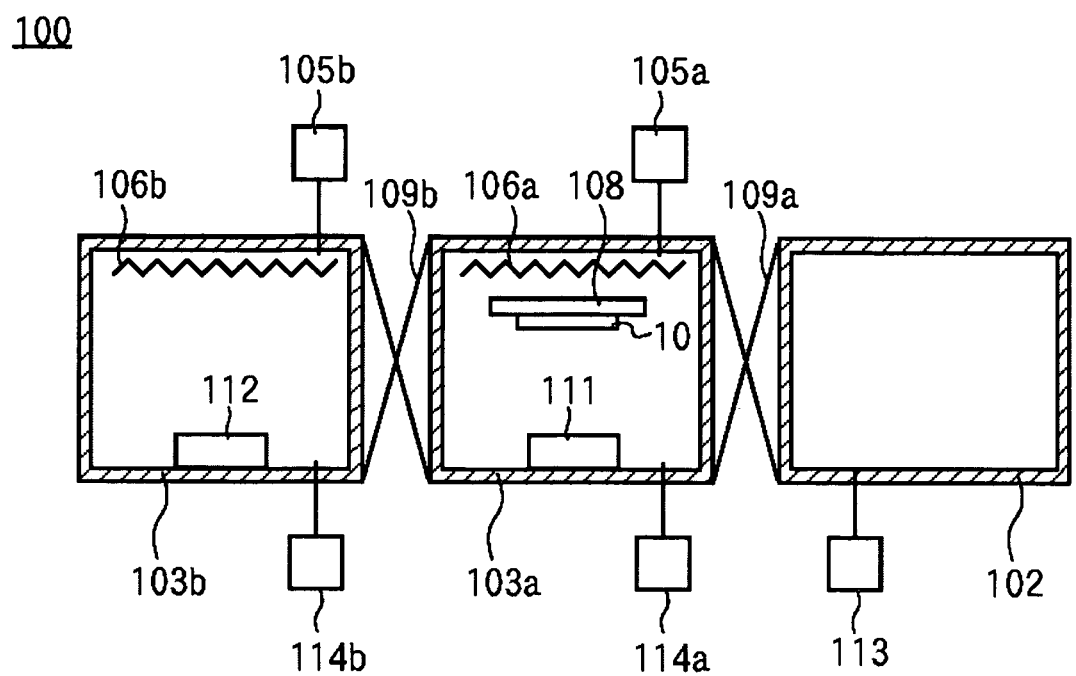
FIG. 5 is a view illustrating a film forming apparatus for producing the transistors according to the present invention.

In FIG. 5, a reference numeral 100 denotes a film forming apparatus for forming a metallic wiring film on a surface of the object to be processed 10.

The film forming apparatus 100 includes a carrying-in-and-out chamber 102, a first film forming chamber 103a, and a second film forming chamber 103b. The carrying-in-and-out chamber 102 and the first film forming chamber 103a, and the first film forming chamber 103a and the second film forming chamber 103b are connected via gate valves 109a and 109b, respectively. Heaters 106a, 106b are respectively arranged in the first film forming chamber 103a and the second film forming chamber 103b.

Vacuum evacuation systems 113, 114a, 114b are respectively connected to the carrying-in-and-out chamber 102 and the first and second film forming chambers 103a, 103b. The gate valves 109a, 109b are closed; and the interiors of the first and second film forming chambers 103a, 103b are evacuated.

Then, a door between the carrying-in-and-out chamber 102 and the open air is opened; the object to be processed 10 is carried into the carrying-in-and-out chamber 102; the door is closed; and the interior of the carrying-in-and-out chamber 102 is evacuated. Thereafter, the gate valve 109a is opened; and the object to be processed 10 is moved into the first film forming chamber 103a and held by a substrate holder 108.

A copper alloy target 111 and a pure copper target 112 are respectively arranged at bottom wall sides inside the first and second film forming chambers 103a, 103b; and the object to be processed 10 is held by the substrate holder 108 in such a manner that the ohmic contact layer 18 may face toward each of the targets 111, 112.

Gas introducing systems 105a, 105b are connected to the first and second film forming chambers 103a, 103b, respectively. When a sputtering gas and an oxidizing gas are introduced from the gas introducing system 105a and the copper alloy target 111 is sputtered, while evacuating the interior of the first film forming chamber 103a, sputtering particles made of constituting materials of the copper alloy targets 111 reach a surface of the ohmic contact layer 18, whereby an adhesion layer in contact with the ohmic contact layer 18 is formed.

The copper alloy target 111 contains Ca (calcium) and copper. A metal (any one or more kinds of Ti, Zr, Mg, Al, Ni and Mn, for example) other than copper and Ca can be added to the copper alloy target 111 as an addition metal, if necessary.

When the total of the atom number of copper, that of Ca and that of another addition metal is taken as 100, Ca is contained in the copper alloy target 111 by 0.1 or more and 5.0 or less. That is, Ca is contained in the copper alloy target 111 at a rate of 0.1 atomic % or more and 5.0 atomic % or less.

When the copper alloy target 111 is sputtered in an atmosphere mixed with the oxidizing gas, an adhesion layer of an oxide composed mainly of copper and containing Ca is formed at an interface of the object 10 to be processed.

Then, the substrate holder 108, with which the object to be processed 10 is held, is moved into the second film forming chamber 103b; and when a sputtering gas is introduced from the gas introducing system 105b and the pure copper target 112 is sputtered, sputtering particles composed of the constituting material (copper atoms) of the pure copper target 112 reach a surface of the object 10 to be processed. As a result, a low-resistance metal layer composed of pure copper is formed on the surface of the adhesion layer. No oxidizing gas is introduced into the second film forming chamber 103b. Here, a thin film of an alloy in which Cu is more than 50 atomic % is taken as the low-resistance metal layer composed mainly of Cu.

Meanwhile, it may be that, without provision of the second film forming chamber 103b, the adhesion layer is formed in the first film forming chamber 103a, and thereafter the introduction of oxygen is stopped, and then a low-resistance metal layer is formed by sputtering the copper alloy target 111 containing Ca.

Figure 4:
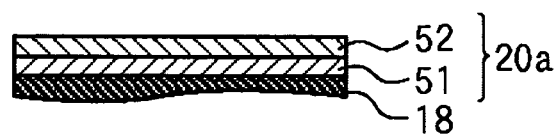
FIG. 4 is a view illustrating a metallic wiring film.

In FIG. 1(b), a reference numeral 20a denotes a metallic wiring film composed of the adhesion layer and the low-resistance metal layer; and reference numerals 51, 52 in FIG. 4 denote the adhesion layer and the low-resistance metal layer, respectively.

A resist film is arranged on a surface of that portion of the metallic wiring film 20a which is located above the gate electrode 12; a laminated film composed of the metallic wiring film 20a, the ohmic contact layer 18 and the high-resistance semiconductor layer 16 is etched; and that portion of the laminated film which is not covered with the resist film is removed.

FIG. 1(c) illustrates a state in which the resist film is removed after the etching of the laminated film; and a reference numeral 20b in FIG. 1(c) denotes the metallic wiring film which is left by covering the metallic wiring film with the resist film.

Next, as shown in FIG. 2(a), a patterned resist film 22 is arranged on the metallic wiring film 20b; and when the object to be processed 10 is immersed into an etching liquid, such as a mixed liquid of phosphoric acid, nitric acid, and acetic acid, a mixed liquid of sulfuric acid, nitric acid, and acetic acid, or a ferric chloride solution, in a state where a surface of the metallic wiring film 20b is exposed at a bottom face of an opening 24 of the resist film 22, the exposed portion of the metallic wiring film 20b is etched, and the metallic wiring film 20b is patterned.

Figure 2:
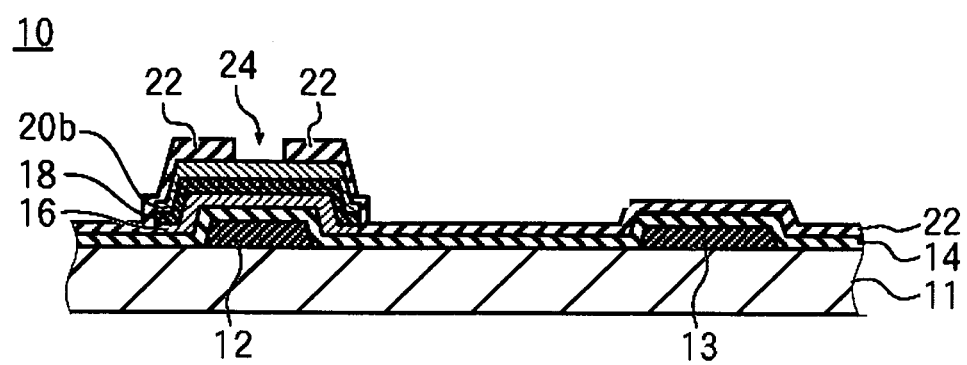
FIGS. 2(a) to (b) are views (2) illustrating the method for producing a transistor according to the present invention.
Figure 2:
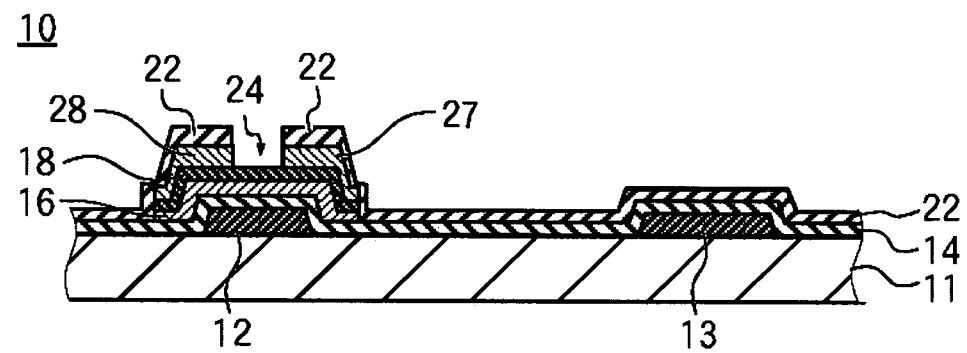

By this patterning, the opening 24 having the ohmic contact layer 18 exposed at the bottom surface is formed at a portion of the metallic wiring film 20b above the gate electrode 12, and the metallic wiring film 20b is separated by the opening 24, whereby the source electrode film 27 and the drain electrode film 28 are formed as shown in FIG. 2 (b).

Figure 3:
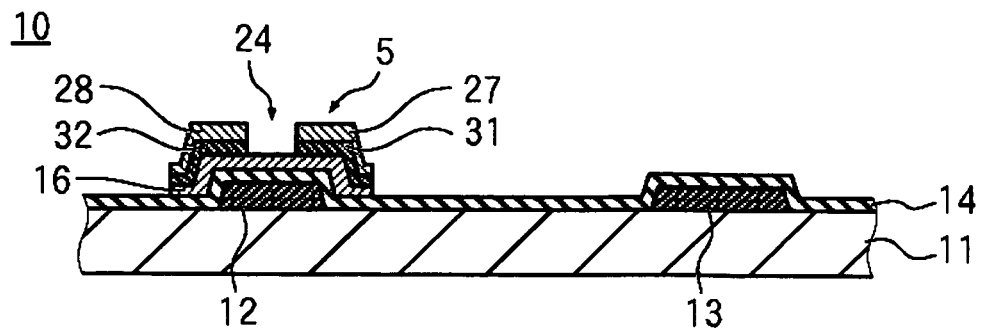
FIGS. 3(a) to (c) are views (3) illustrating the transistor producing method according to the present invention.
Figure 3:
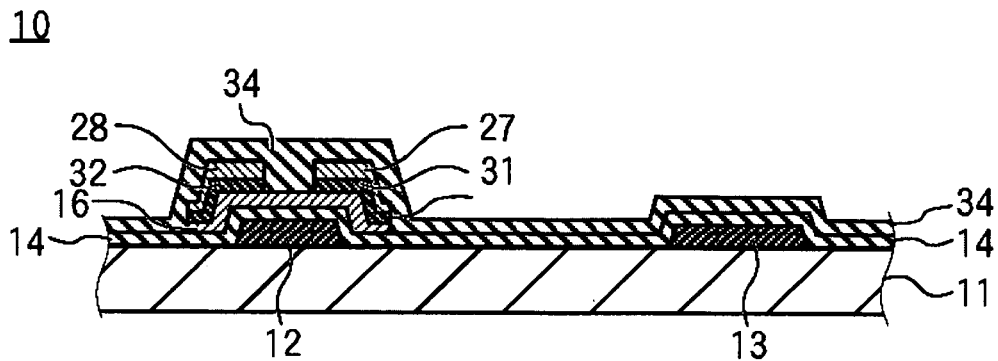
Figure 3:
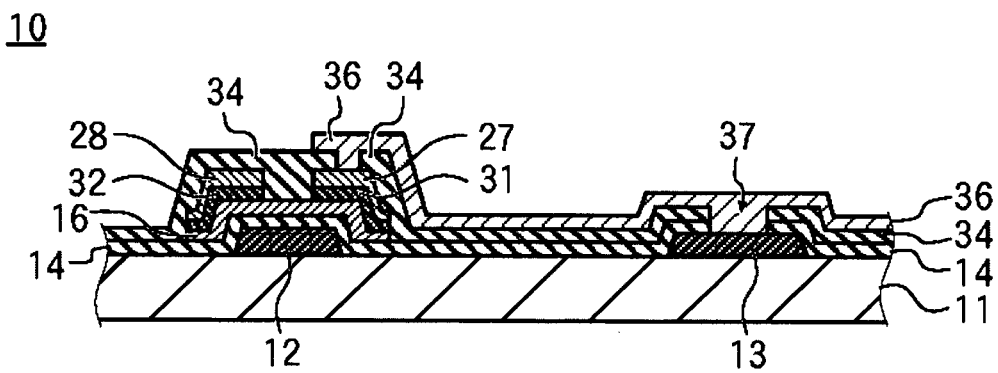

Then, the object 10 is carried into an etching device; and the ohmic contact layer 18 exposed at the bottom face of the opening 24 is etched by exposure to a plasma of an etching gas; and the high-resistance semiconductor layer 16 is exposed at the bottom face of the opening 24 formed in the ohmic contact layer 18 (FIG. 3(a)).

The opening 24 formed in the ohmic contact layer 18 is located above the gate electrode 12; and the ohmic contact layer 18 is separated into a source region 31 and a drain region 32 by the opening 24. Thereby, a transistor 5 of an inverse-staggered type (a bottom gate type in which a gate electrode is located below) according to the present invention can be obtained.

A surface of the high-resistance semiconductor layer 16 is exposed at the bottom face of the opening 29, and if the high-resistance semiconductor layer 16 is exposed to the plasma of the etching gas in etching the ohmic contact layer 18, hydrogen atoms are lost from the surface of the high-resistance semiconductor layer 16, so that dangling bonds are formed.

The dangling bond causes characteristic defects of a TFT, such as leakage current. In order to remodify the dangling bonds with hydrogen, when a plasma of hydrogen is generated by introducing the hydrogen in a state where the source electrode film 27 and the drain electrode film 28 are exposed as shown in FIG. 3(a) and the high-resistance semiconductor layer 16 exposed at the bottom of the opening 24 is exposed to the hydrogen gas plasma, silicon atoms at the surface of the high-resistance semiconductor layer 16 are combined with hydrogen, whereby the dangling bonds disappear.

The metallic wiring film 20a (20b) of the present invention includes the adhesion layer 51 in which the source electrode film 27 and the drain electrode film 28 are composed mainly of copper and contain Ca at a rate of 0.1 atomic % or more and 5.0 atomic % or less.

Here, the rate of Ca in the adhesion layer 51 is a value obtained by dividing the number of Ca atoms contained in the adhesion layer 51 by the total of atom number of metallic components (copper, Ca and other addition metal (s)) contained in the adhesion layer 51 and multiplying the obtained value by 100.

The adhesion layer 51 comes in close contact with silicon and silicon dioxide of the transistor, and even when the source electrode film 27 and the drain electrode film 28 are exposed to the hydrogen plasma, the Ca-containing oxide formed at an interface between the ohmic contact layer 18 (the source region 31 and the drain region 32) and the adhesion layer 51 is not reduced, so that the electrode film constituted by the metallic wiring film 20a (20b), such as the source electrode film 27 or the drain electrode film 28, does not peel.

After the treatment with the hydrogen plasma, a passivation film 39, such as a film of silicon nitride ($SiN_x$), is formed, as shown in FIG. 3(b); a contact hole 37 is formed in the passivation film 34; and thereafter, as shown in FIG. 3(c), a transparent electrode film 36 is formed to connect the source electrode film 27 or the drain electrode film 28 with the pixel electrode film 13 or the like.

Meanwhile, $Cl_2$, HBr, HCl, $CBrF_3$, $SiCl_4$, $BCl_3$, $CHF_3$, $PCl_3$, HI, $I_2$ or the like are recited as gases usable to etch a silicon layer (including a polysilicon layer and an amorphous silicon layer). One kind of these halogen gases may be used singly as the etching gas, or a mixture of two or more kinds thereof may be used as the etching gas. In addition, an addition gas other than the halogen gases, such as $O_2$, $N_2$, $SF_6$, $N_2$, Ar, or $NH_3$, may be added to the etching gas.

The above-described halogen gases can be used for etching other objects to be etched, such as silicon nitride (SiN), silicon oxide ($SiO_2$), GaAs, $SnO_2$, Cr, Ti, TiN, W, or Al.

As the etching gas for polysilicon, there are $Cl_2$, $Cl_2$+HBr, $Cl_2$+$O_2$, $CF_4$+$O_2$, $SF_6$, $Cl_2$+$N_2$, $Cl_2$+HCl, HBr+$Cl_2$+$SF_6$ or the like, for example.

As the etching gas for Si, there are $SF_6$, $C_4F_8$, $CBrF_3$, $CF_4$+$O_2$, $Cl_2$, $SiCl_4$+$Cl_2$, $SF_6$+$N_2$+Ar, $BCl_2$+$Cl_2$+Ar, $CF_4$, $NF_3$, $SiF_4$, $BF_3$, $XeF_2$, $ClF_3$, $SiCl_4$, $PCl_3$, $BCl_3$, HCl, HBr, $Br_2$, HI, $I_2$ or the like, for example.

As the etching gas for amorphous silicon, there are $CF_4$+$O_2$, $Cl_2$+$SF_6$ or the like, for example. The sputtering gas is not limited to Ar, and Ne, Xe or the like can be used besides Ar. The oxidizing gas is not limited to $O_2$, and, so long as an oxygen atom is contained in the chemical structure, for example, $CO_2$, $H_2O$ or the like can be used besides $O_2$. These oxidizing gases may be singly used, or a mixture of two or more kinds thereof may be used.

In addition, the adhesion layer 51 formed according to the present invention can be used not only for the source electrode and the drain electrode of the TFT but also for the gate electrode of the TFT and barrier films and electrodes (wiring films) of other electronic parts, such as semiconductor elements or wiring boards.

EXAMPLES

After an adhesion layer of 50 nm was formed on a glass substrate or an Si layer by sputtering a copper alloy target 111 with use of an argon gas as a sputtering gas and with use of an oxygen gas as an oxidizing gas, a low-resistance metal layer of 300 nm was formed on the adhesion layer by sputtering a pure copper target 112 with use of the argon gas, thereby obtaining a metallic wiring film of a double layer structure. The temperature of the substrate was 100° C.; the sputtering gas was Ar gas; and the sputtering pressure was 0.4 Pa.

In this case, the Si layer consists of silicon nitride ($SiN_x$), an amorphous silicon (a-Si) layer and an n-type amorphous silicon ($n^+$a-Si) layer formed on the surface of the glass substrate in the described order.

After a surface of the formed metallic wiring film was exposed and then exposed to the hydrogen plasma, a film of silicon nitride was formed on its surface.

The treatment with the hydrogen gas plasma was performed under the condition that the flow rate of the hydrogen gas was 500 sccm, the pressure was 200 pa, the temperature of the substrate was 250° C., the power was 300 W, and the amount of time for the treatment was 60 seconds.

The silicon nitride film was formed under the condition that $SiH_4$, $NH_3$ gas, and $N_2$ gas were introduced at the rates of 20 sccm, 300 sccm, and 500 sccm, respectively, into a CVD apparatus, in which the substrate was placed, the pressure was 120 Pa, the temperature of the substrate was 250° C., and the power was 300 W.

With respect to the metallic wiring film formed on the glass substrate, the adhesion before the exposure to the hydrogen plasma (adhesion as deposition) was examined. Further, both the metallic wiring film formed on the glass substrate and the metallic wiring film formed on the Si layer were exposed to the hydrogen plasma, and the adhesion was examined after the silicon nitride film was formed on the surfaces thereof.

Meanwhile, the adhesion was measured by a tape peeling test after adhering with an adhesive tape, and glass substrates and Si layers having their surfaces exposed were evaluated as "x", while the others were evaluated as "o".

Experiments were performed in such a manner that the content rate of Ca in the copper alloy target 111 and the introducing rate of the oxidizing gas were changed. Evaluation results are shown as "Adhesion" in the following Table 1 together with the content rate of Ca in the copper alloy target 111 and the introducing rate of the oxidizing gas.

Further, after the metallic wiring film formed on the Si layer was annealed in a vacuum atmosphere and the metallic wiring film was removed by etching, its surface was observed with a SEM, and presence or absence of diffusion of copper into the silicon was observed.

In each of the above-described experiments, the sputtering gas was an argon gas, the oxidizing gas was an oxygen gas, and the partial pressure of the sputtering gas in the sputtering atmosphere was 0.4 Pa.

Observation results are shown as "Barrier property" in the following Table 1. Those in which the diffusion of copper into the silicon was observed were shown as "x", and those in which no diffusion was observed were shown as "o".

TABLE 1

Adhesion, barrier property, $H_2$ plasma resistance (addition metal Ca)

| Electrode structure | Addition element | Addition amout (at %) | $O_2$ addition amout (%) | Adhesion (Glass) | Barrier (350° C.) | Adhesion after treatment with $H_2$ plasma Glass | Si |
|---|---|---|---|---|---|---|---|
| Pure copper or Cu—Ca/Cu—Ca—O | Ca | 0.1 | 0 | X | X | X | X |
| | | | 1 | X | X | X | X |
| | | | 3 | O | O | O | O |
| | | | 5 | O | O | O | O |
| | | | 10 | O | O | O | O |
| | | | 15 | O | O | X | X |
| | | | 20 | O | O | X | X |
| | | 0.5 | 0 | X | X | X | X |
| | | | 1 | X | X | X | X |
| | | | 3 | O | O | O | O |
| | | | 5 | O | O | O | O |
| | | | 10 | O | O | O | O |
| | | | 15 | O | O | O | O |
| | | | 20 | O | O | X | X |
| | | 1.0 | 0 | X | X | X | X |
| | | | 1 | O | X | X | X |
| | | | 3 | O | O | O | O |
| | | | 5 | O | O | O | O |
| | | | 10 | O | O | O | O |
| | | | 15 | O | O | O | O |
| | | | 20 | O | O | O | O |
| | | 2.0 | 0 | X | X | X | X |
| | | | 1 | O | O | X | X |
| | | | 3 | O | O | O | O |
| | | | 5 | O | O | O | O |
| | | | 10 | O | O | O | O |
| | | | 15 | O | O | O | O |
| | | | 20 | O | O | O | O |
| | | 5.0 | 0 | X | X | X | X |
| | | | 1 | O | O | O | X |
| | | | 3 | O | O | O | O |
| | | | 5 | O | O | O | O |
| | | | 10 | O | O | O | O |
| | | | 15 | O | O | O | O |
| | | | 20 | O | O | O | O |

Experimental results are shown in Table 2 with respect to cases where a pure copper target 112 was used instead of the copper alloy target 111 and cases where Mg was used as an addition element instead of Ca.

TABLE 2

Adhesion, barrier property, $H_2$ plasma resistance (addition metal Mg or no addition metal)

| Electrode structure | Addition element | Addition amout (at %) | $O_2$ addition amout (%) | Adhesion (Glass) | Barrier (350° C.) | Adhesion after treatment with $H_2$ plasma Glass | Si |
|---|---|---|---|---|---|---|---|
| Pure copper/ Cu—O | No | No | 0 | X | X | X | X |
| | | | 1 | X | X | X | X |
| | | | 3 | X | X | X | X |
| | | | 5 | ○ | ○ | X | X |
| | | | 10 | ○ | ○ | X | X |
| | | | 15 | ○ | ○ | X | X |
| | | | 20 | ○ | ○ | X | X |
| Pure copper or Cu—Mg/Cu—Mg—O | Mg | 1.8 | 0 | X | X | X | X |
| | | | 1 | X | X | X | X |
| | | | 3 | ○ | ○ | X | X |
| | | | 5 | ○ | ○ | X | X |
| | | | 10 | ○ | ○ | X | X |
| | | | 15 | ○ | ○ | X | X |
| | | | 20 | ○ | ○ | X | X |

Note that addition amounts of $O_2$ in the above Tables 1 and 2 were introduction amounts (volumes) of $O_2$ when the introduction amount (volume) of the sputtering gas is taken as 100.

From the above-described results, it is found that when Ca is contained in the copper alloy target 111 by 0.1 atomic % or more, the adhesion (the adhesion before and after the $H_2$ plasma treatment) and the barrier property are good.

In addition, it is seen from the above Table 1 that the adhesion and the barrier property are good when Ca is contained in the copper alloy target 111 by 5 atomic % and that the upper limit of the addition amount of Ca in the present invention is 5 atomic % or more. However, if the content of Ca becomes too much, the copper alloy target 111 is difficult to be mold, so that the upper limit of the content of Ca is preferably 5 atomic %.

Further, it is seen that the oxidizing gas may be introduced in an amount of 3 parts by volume or more and 20 parts by volume or less with respect to the introduction amount of 100 parts by volume of the argon gas.

What is claimed is:

1. A method for producing a thin film transistor, comprising the steps of:
   a gate electrode forming step of forming a gate electrode on an object to be processed;
   a gate insulating layer forming step of forming a gate insulating layer on the gate electrode;
   a high-resistance semiconductor layer forming step of forming a high-resistance semiconductor layer made of a semiconductor layer on the gate insulating layer;
   an ohmic contact layer forming step of forming an ohmic contact layer on the semiconductor layer;
   a metallic wiring film forming step of forming a metallic wiring film on the ohmic contact layer; and
   an etching step of, by patterning the ohmic contact layer and the metallic wiring film, forming a source region and a drain region from the ohmic contact layer and forming a source electrode on the source region and a drain electrode on the drain region from the metallic wiring film,
   wherein the metallic wiring film forming step includes an adhesion layer forming step of sputtering a target of a copper alloy containing Ca and copper in a vacuum atmosphere through introduction a gas containing a sputtering gas and an oxidizing gas and forming an adhesion layer containing copper, Ca and oxygen on the ohmic contact layer,
   wherein the high-resistance semiconductor layer is exposed in the etching step, and a plasma-exposed step, in which a surface of the high-resistance semiconductor layer, a surface of the source electrode and a surface of the drain electrode are exposed to a plasma containing a hydrogen gas in a state where those surfaces are exposed, is provided after the etching step.

2. The method for producing the thin film transistor according to claim 1, wherein the copper alloy target contains Ca at a rate of 0.1 atomic % or more and 5.0 atomic % or less.

3. The method for producing the thin film transistor according to claim 1, wherein, in the metallic wiring film forming step, a low-resistance metal layer forming step, in which a low-resistance metal layer having a lower resistance than the adhesion layer is formed on the adhesion layer, is provided after the adhesion layer forming step.

4. The method for producing the thin film transistor according to claim 3, wherein the low-resistance metal layer is composed of a copper alloy or pure copper.

5. The method for producing the thin film transistor according to claim 1, wherein an $O_2$ gas is used as the oxidizing gas, and the $O_2$ gas is contained in a range of 3 parts by volume or more and 20 parts by volume or less relative to 100 parts by volume of the sputtering gas.

* * * * *